United States Patent
Doering et al.

(10) Patent No.: US 7,825,524 B2
(45) Date of Patent: Nov. 2, 2010

(54) QFN HOUSING HAVING OPTIMIZED CONNECTING SURFACE GEOMETRY

(75) Inventors: Anton Doering, Reutlingen (DE); Stefan Mueller, Wasserburg (DE); Frieder Haag, Wannweil (DE); Christoph Gahn, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 424 days.

(21) Appl. No.: 11/731,054

(22) Filed: Mar. 30, 2007

(65) Prior Publication Data

US 2007/0232095 A1 Oct. 4, 2007

(30) Foreign Application Priority Data

Mar. 30, 2006 (DE) .................. 10 2006 015 222

(51) Int. Cl.
*H01L 23/48* (2006.01)
*H01L 23/52* (2006.01)
*H01L 29/40* (2006.01)

(52) U.S. Cl. .............................. 257/786; 257/E23.026; 257/E23.033; 257/E23.061

(58) Field of Classification Search ................ 257/678, 257/684, 737, 738, 784, 779, 786, E23.02, 257/E23.026, E23.033, E23.061; 228/180.22
See application file for complete search history.

(56) References Cited

U.S. PATENT DOCUMENTS

| | | | | |
|---|---|---|---|---|
| 5,990,545 | A * | 11/1999 | Schueller et al. | ............. 257/697 |
| 6,900,551 | B2 * | 5/2005 | Matsuzawa et al. | ......... 257/786 |
| 2001/0015481 | A1 * | 8/2001 | Miyaki et al. | ................ 257/673 |
| 2002/0182776 | A1 * | 12/2002 | Fujisawa et al. | ............. 438/118 |
| 2003/0001252 | A1 * | 1/2003 | Ku et al. | ...................... 257/686 |
| 2005/0093117 | A1 * | 5/2005 | Masuda et al. | .............. 257/676 |
| 2005/0199987 | A1 * | 9/2005 | Danno et al. | ................. 257/672 |

* cited by examiner

*Primary Examiner*—Minh-Loan T Tran
*Assistant Examiner*—Leslie Pilar Cruz
(74) *Attorney, Agent, or Firm*—Kenyon & Kenyon LLP

(57) ABSTRACT

A semiconductor system or sensor system in a housing which is butt-joined to a printed circuit board by soldering, at least some of the connecting surfaces not being soldered over their entire area, the connecting surfaces which are not soldered over their entire area being fixedly soldered in a first surface region to a section of a printed conductor, and in a second surface region the connecting surfaces not being fixedly connected to the printed circuit board, the securely soldered surface regions being situated closer to the semiconductor or sensor structure to be contacted than are the surface regions which are not fixedly connected to the printed circuit board.

8 Claims, 2 Drawing Sheets

QFN HOUSING HAVING OPTIMIZED CONNECTING SURFACE GEOMETRY

BACKGROUND INFORMATION

It is becoming increasingly common to embed sensors and semiconductors in leadless housings, i.e., QFN housings. These housings, in contrast to classical housings of switching circuits or sensors, such as PLCC or SOIC housings, have no terminal pins extending from the housing, but instead are butt-joined to printed circuit boards by soldering.

For this purpose, in addition to the chip components or sensor components contained in the housing, connecting surfaces are integrated into the housing region. The connecting surfaces are usually formed by small metal bodies which project at the underside of the housing as raised solder-connectable surfaces beyond the housing base or adjoin the same in flush alignment, and extend inside the housing to a level in which the chip structure is located. According to the related art, the connecting surfaces and the chip components to be contacted are electrically connected via bond connections before the housing is completed, and the chip structure contained therein is generally completely sealed.

According to the related art, the connecting surfaces are dimensioned in such a way that defect-free wire bonding is possible, and at the same time a sufficiently secure soldered connection to a negligibly small electrical resistance may be easily realized. These requirements are met by use of relatively small connecting surfaces, as the result of which a very compact design for the formation of connecting surfaces has become established which may be found in most of the QFN housings currently in use.

The position of the contact surfaces depends, among other factors, on technologically dictated design specifications for wire bonding, for which it is necessary to take into consideration as an essential boundary condition a minimum bonding angle relative to the contact surface, also referred to as the bonding land, between the bonding wire and the normal to the surface, which must not be less than a minimum value when the bonding wire is guided through. Guiding the bonding wire out of the chip structure in a flat manner is generally regarded as advantageous; in no case should the bonding angle in question be less than 45°.

Large bonding angles may be consistently achieved when the contact surface is located at a sufficient distance from the chip structure to be contacted. Since the numerous contact surfaces necessary for complete contacting of a complex chip structure are generally situated in the housing's edge region which entirely encloses the chip structure, in conventional QFN housings distances are sometimes provided between diagonally opposite contact surfaces and the soldering sites defined thereby on the printed circuit board which exceed by far the extension of the actual chip structure, while taking into account the applicable design specifications, in particular the importance of the minimum bonding angle. This applies very particularly for the use of relatively thick chips or chip stacks, in which regions superposed in multiple levels are to be contacted, resulting in large dimensions for the housing.

The printed circuit board and customary chip housing used are generally characterized by differing coefficients of thermal expansion. Since many electrical circuits, in particular for use in motor vehicles, must maintain functionality over large temperature ranges, considerable importance is accorded to the consideration of thermal stresses.

Sensors in particular respond in a sensitive manner to bending, which may result from differing thermal expansions of the printed circuit board and chip housing. The problem of undesirable bending intensifies with increasing geometric dimensions. From the standpoint of low sensitivity to temperature, the aim should be to achieve the smallest possible distance between the individual soldered surfaces. However, as previously described, in the established technology the boundary conditions resulting from the bonding connection conflict with this requirement.

An object of the present invention is to make it possible to reduce the bending stress of semiconductor systems or sensor systems caused by temperature changes in butt-joined soldered housings.

SUMMARY OF THE INVENTION

The object is achieved by a semiconductor system or sensor system in a housing which is butt-joined to a printed circuit board by soldering, according to the present invention.

The present invention is directed to the aim to avoid establishing bond connections in a region of the connecting surfaces situated directly above the fixed soldered connection between the metal bodies used as connecting surfaces and the particular associated printed conductors. However, only the relative position of these regions with respect to one another determines the mechanical characteristics of the composite made up by the chip housing and printed circuit board, i.e., stress effects resulting from differing coefficients of thermal expansion. According to the present invention, one surface region of a connecting surface is fixedly soldered to a printed conductor, and another surface region of the connecting surface is not fixedly connected to the printed circuit board, in particular to the printed conductor. The surface region, which is fixedly soldered to a printed conductor, is located in a position near the chip, whereas the surface region without a fixed connection to the printed circuit board extends at least into an edge zone of the housing which is more remote from the chip. A fixed connection in the sense of the present invention is understood to mean a connection in which the zone of the shortest connection between two oppositely situated surface regions is fulfilled by a connecting means, in particular a solder, which is firmly adherent to both surface regions.

The present invention encompasses a semiconductor system or sensor system in a housing which is butt-joined to a printed circuit board by soldering and to which at least some of the connecting surfaces are not soldered over their entire area, the connecting surfaces not soldered over their entire area being fixedly soldered to a printed conductor section in a first surface region, and the connecting surfaces not being fixedly connected to the printed circuit board in a second surface region, the fixedly soldered surface regions being situated closer to the semiconductor or sensor structure to be contacted than are the surface regions which are not fixedly connected to the printed circuit board. This results in surface regions on the connecting surfaces which are located at a relatively great distance from the actual chip system and which may be used for attaching the bonding wire without contributing to the thermal soldering stress.

If all connecting surfaces do not have the soldered connection according to the present invention, it is practical to reduce the largest distances between soldered surface regions by securing at least some connecting surfaces, separated by great distances from other connecting surfaces, via the soldering according to the present invention to the printed circuit board.

In this manner it is possible to reduce at least the maximum stress-relevant lengths. For example, connecting surfaces diagonally opposite from one another in the housing should not both be soldered over their entire surface.

The surfaces which in the case of soldering are fixedly connected to one another are generally specified by delimiting these surfaces using appropriate lacquer coverings. It is very common to prepare solder lands on printed circuit boards or printed conductors by use of lacquer coverings to protect the adjoining regions from wetting from the solder used. When printed circuit boards prepared in this manner are used, the present invention is advantageously embodied by a semiconductor system or sensor system in a housing which is butt-joined by soldering to a printed circuit board which contains metal bodies used as connecting surfaces and which have solder-wetted surfaces on the underside of the housing, at least in places, and which inside the housing are conductively connected to the semiconductor system or sensor system via bond connections, the extension of at least some of the metal bodies in a plane parallel to the printed circuit board being greater than the surface section of the printed conductor which leads to the particular connecting surface and which is in direct contact with the solder, and the bond connection on these metal bodies is implemented in a surface region not situated directly above the fixed soldered connection between the metal bodies used as connecting surfaces and the particular associated printed conductors. The regions of the fixed soldered connections are closer to the middle of the housing than are the surface regions in which the bond connection is realized. Thus, the connecting surfaces have regions which project considerably beyond the regions of the fixed soldered connections. In this manner space is obtained in order to implement the bond connections at a sufficient distance from the chip structure without increasing the risk of excessive deformation in the event of temperature variations.

Depending on the soldering technology employed, the connecting surfaces may be prepared in such a way that the metal bodies used as connecting surfaces project as raised surfaces beyond the housing, on the underside of the housing base, or adjoin it in flush alignment. It is particularly advantageous when it is possible for all connecting surfaces to be uniformly attached; i.e., the extension of all metal bodies used as contact surfaces in a plane parallel to the printed circuit board is greater than the surface section of the printed conductor which leads to the particular connecting surface and which is in direct contact with the solder, and of all the connecting surfaces only the surface section near the chip is fixedly soldered to the printed conductor, whereas regions more remote from the chip are used for the particular bond connection. In this manner it is possible to achieve particularly uniform reduction in the stress and bending load, compared to conventional QFN housings, when the connecting surfaces are symmetrically positioned around the chip structure.

The shape of the connecting surfaces should be maintained in such a way that a closely adjoining configuration is enabled in order to allow numerous chip regions contacted according to the present invention to be addressed. It is therefore advantageous when the metal bodies used as connecting surfaces have a principal direction of extension which runs from the edge of the housing into the central region of the housing, and have a length-to-width ratio greater than 2:1 in the plane parallel to the printed circuit board. Even more preferable is a ratio of the sides that is greater than 3:1, since the geometric decoupling of the attachment site of the connecting surface on the printed circuit board from the position of the bond connection on the connecting surface according to the present invention may have an even better effect when the connecting surfaces are situated even more closely to one another.

As a result of the possibility of greatly outwardly displacing the bonding sites to a sufficient distance from the chip structure without increasing the stress introduced into the composite made up by the housing and printed circuit board, it is not critical if the metal bodies used as connecting surfaces have a bonding surface inside the housing which is situated at the level at which the chip structure of the semiconductor system or sensor system rests; i.e., a relatively great height difference must be overcome during bonding. In view of the usability of an established bonding technology, this represents a significant advantage, even if a chip structure is contained which includes multiple superposed levels which are connected via bonding wires to connecting surfaces.

A particularly effective geometric decoupling of the attachment site of the connecting surface on the printed circuit board from the position of the bond connection may be implemented when the metal bodies used as contact surfaces are situated in such a way that the surface section of the printed conductor leading to the particular connecting surface which is in direct contact with the solder extends at least partially beneath the chip structure, whereas the bond connection to the connecting surface is positioned next to the chip structure at a sufficient distance away. In this manner, stress-relevant lengths within the overall system may be reduced to the extension of the actual chip structure, although the contacting of the topmost chip level to be contacted may be carried out at a bonding angle that is always greater than 45°, preferably greater than 60°.

DETAILED DESCRIPTION

Figure 1:
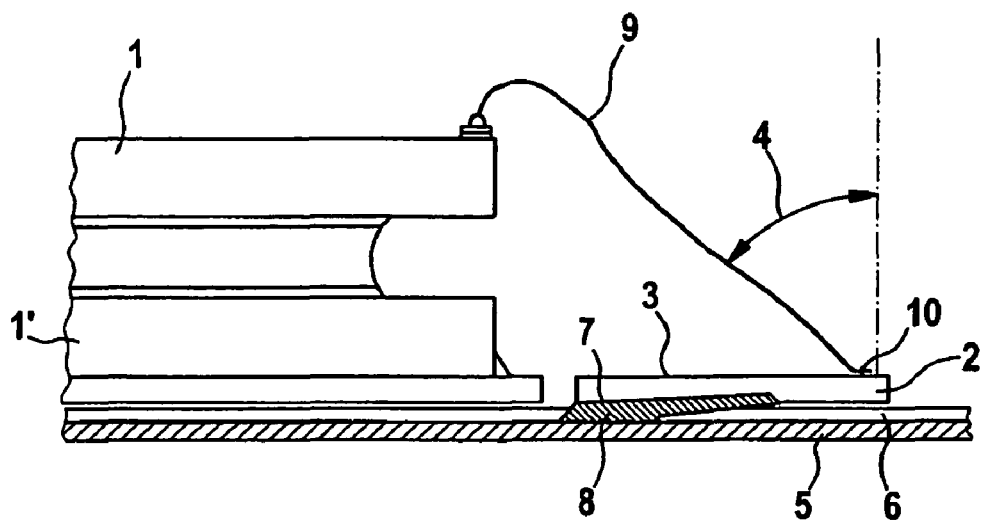
FIG. 1 shows a sectional illustration of a contact according to the present invention.

FIG. 1 shows a sectional illustration of a contact according to the present invention. A chip structure having two superposed levels 1, 1' to be contacted is located next to metal bodies 2 which are used as connecting surfaces and which in the present case have been formed by copper plates of a leadframe provided by an etching technique. Contact surface 3 provided for the bond connection runs in a plane coinciding with the underside of the chip structure. The resulting height difference to be spanned in the bonding of topmost level 1 may be in a range of 1 mm. For a minimum bonding angle 4 of 45°, it follows that the distance from the edge of chip level 1 to be contacted to the site of the bond connection on contact surface 3 must be relatively large. According to the present invention, when it is soldered to a printed conductor 5, connecting surface 2 is not connected over its entire surface to the material of printed conductor 5. Instead, a cover lacquer 6 ensures that a fixed connection to the printed conductor occurs only in a surface region 7 located in a position near the chip. Although solder 8 which produces the fixed connection wets a greater surface region of metal body 2 which is used as a connecting surface, it is not possible to achieve a fixed connection above cover lacquer 6. The outer portion of metal body 2 thus floats in a relatively flexible manner above printed conductor 5 or projects without contact beyond printed conductor 5, in either case without the possibility of appreciable absorption of force. Bonding wire 9 is attached to contact surface 3 in a surface region 10 which is not fixedly connected to the printed circuit board and which is located a further distance away from the chip structure than surface region 7, which is fixedly connected to printed conductor 5.

The embodiment of FIG. 1 is illustrated with reference to a chip structure having multiple levels. The number of levels is arbitrary, and only one level may also be provided.

Figure 2:
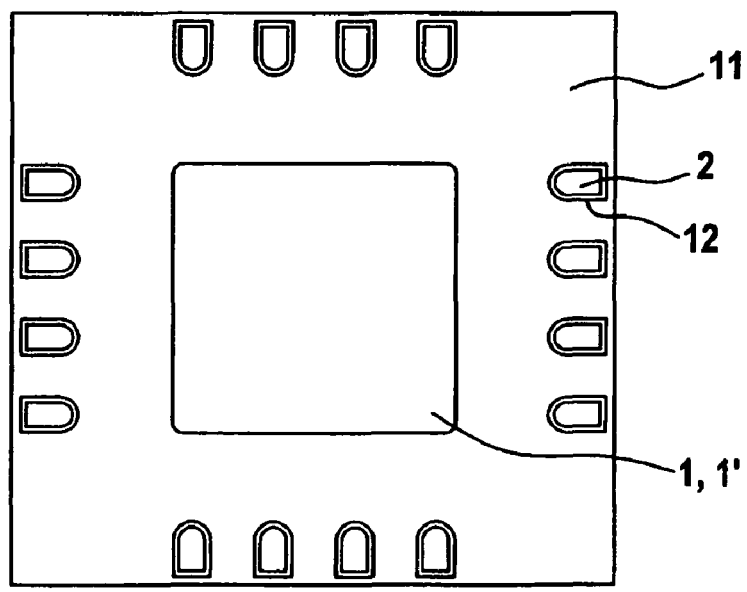
FIG. 2 shows a bottom view of a conventional QFN housing.

FIG. 2 shows a bottom view of a conventional QFN housing 11. The square region in the center illustrates the position of the actual chip structure together with levels 1, 1' to be contacted. The outer square represents the edge of housing 11. Near the edge and at a considerable distance from the chip structure are located metal bodies 2, used as connecting surfaces, to which respective soldered surfaces 12 on printed conductors correspond. The shape and size of metal bodies 2 and soldered surfaces 12 are essentially identical. It follows that the bond connection to these metal bodies 2 is implemented in surface regions which are situated directly above the fixed soldered connection between metal bodies 2 used as connecting surfaces and the respective associated printed conductors.

Figure 3:
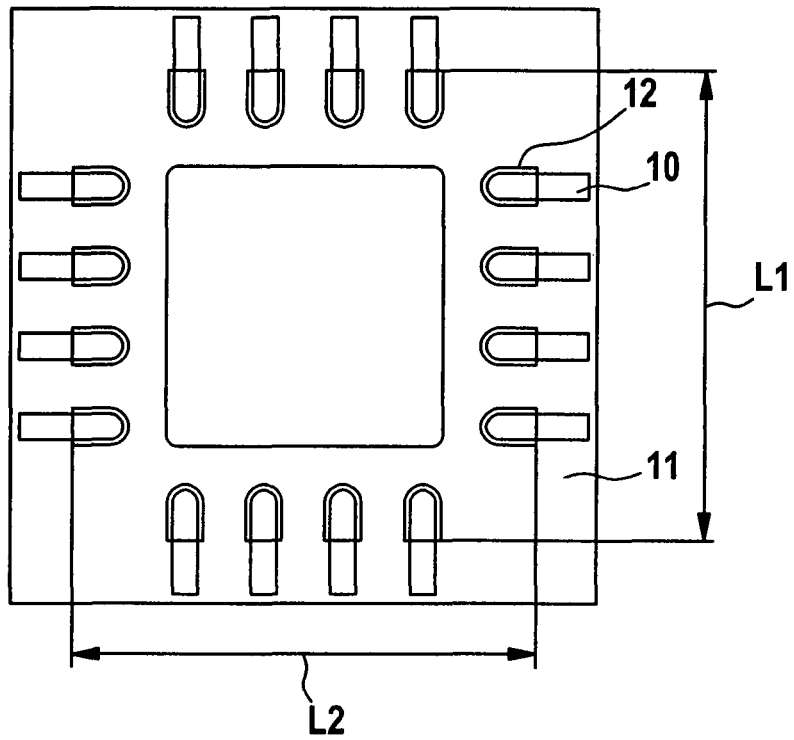
FIG. 3 shows a bottom view of a QFN housing according to the present invention.

FIG. 3 shows a bottom view of a QFN housing according to the present invention, having elongated metal bodies 2 which are used as connecting surfaces. Soldered surfaces 12 have a similar shape to those in FIG. 2, but are located essentially in a position nearer to the chip. The elongation of the connecting surfaces allows surface regions 10 which are not fixedly connected to the printed circuit board and which are located farther from the chip structure, but which have no influence on the soldering stress and the bending response of the entire system. L1 and L2 are the lengths which determine the soldering stress.

Figure 4:
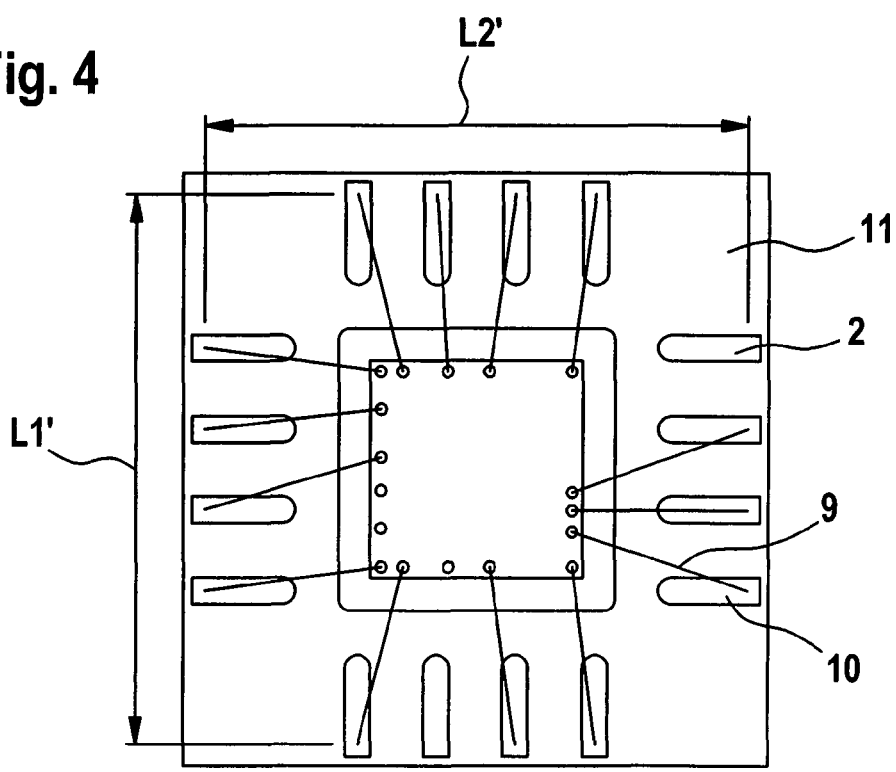
FIG. 4 shows a bonding diagram of the QFN housing according to the present invention.

FIG. 4 shows a bonding diagram of the QFN housing according to the present invention. Bonding wires 9 all terminate relatively near to the edge in surface regions 10 which are not fixedly connected to the printed circuit board, and to which, by comparison with FIG. 3, no mechanical influence on the bending and stress response of the overall system may be attributed. However, dimensions L1' and L2' are provided for maintaining the geometric boundary conditions for the wire bonding.

FIGS. 3 and 4 show the combination, important to the present invention, of a longitudinally extended connecting surface in the housing and a considerably smaller solder land on the printed circuit board. In comparison to the related art, the connecting surfaces on the housing are elongated, whereas the solder lands on the printed circuit board are shifted only near the chip. The housing therefore mechanically responds in the manner of a much smaller housing. For example, it is thus possible to construct a QFN housing which, for external housing dimensions of 6×6 mm$^2$, exhibits a bending and stress response similar to that of a conventional QFN housing having dimensions of 5×5 mm$^2$.

What is claimed is:

1. A system, comprising:
 a housing;
 a chip structure situated in a central region inside the housing;
 metal bodies used as connecting surfaces, the metal bodies being conductively connected via bond connections inside the housing to the chip structure, and the metal bodies being exposed on an underside of the housing;
 wherein a first surface region of at least one of the metal bodies is fixedly soldered to a conductive section of a printed circuit board and a second surface region of the at least one of the metal bodies is not fixedly connected to the printed circuit board, the solder wets a larger area of the first surface region than that of the conductive section of the printed circuit board to which the first surface region is fixedly soldered, the first and second surface regions being in a plane parallel to the printed circuit board and the first surface region being situated closer to the central region of the housing than the second surface region, and
 wherein a bond connection between the at least one of the metal bodies and the chip structure contacts the at least one of the metal bodies in a contact region directly above the second surface region which is not fixedly connected to the printed circuit board.

2. The system according to claim 1, wherein the metal bodies used as connecting surfaces project as raised surfaces beyond a housing base at the underside of the housing, so that an empty space is created between each of the raised surfaces of the metal bodies and the housing base.

3. The system according to claim 1, wherein the metal bodies used as connecting surfaces each have a bonding surface inside the housing which is situated at a level at which the chip structure of the system rests.

4. The system according to claim 1, wherein the chip structure comprises multiple superposed levels of semiconductors which are connected via bonding wires to the metal bodies used as connecting surfaces.

5. The system according to claim 1, wherein the chip structure includes at least one of a semiconductor and a sensor which is connected via bonding wires to the metal bodies used as connecting surfaces.

6. The system according to claim 1, wherein the bond connections between the metal bodies and the chip structure contact the chip structure at a topmost chip level, and the contact region of each of the metal bodies on which the bond connections make contact extends so far into an edge region of the housing that the bond connections form a bonding angle that is greater than 45°.

7. The system according to claim 1, wherein the metal bodies used as connecting surfaces have a length-to-width ratio greater than 2:1 in the plane parallel to the printed circuit board, wherein the length of the metal bodies is measured in a direction which runs from an edge of the housing toward the central region of the housing.

8. The system according to claim 7, wherein the metal bodies used as connecting surfaces have a length-to-width ratio greater than 3:1 in the plane parallel to the printed circuit board.

* * * * *